United States Patent [19]

Nakajima et al.

[11] Patent Number: 5,094,787
[45] Date of Patent: Mar. 10, 1992

[54] METHOD OF MANUFACTURING ITO SPUTTERING TARGET

[75] Inventors: Koichi Nakajima; Noriaki Sato, both of Kitaibaraki, Japan

[73] Assignee: Nippon Mining Co., Ltd., Tokyo, Japan

[21] Appl. No.: 616,559

[22] Filed: Nov. 21, 1990

[30] Foreign Application Priority Data

Jan. 8, 1990 [JP] Japan ......................... 2-1210

[51] Int. Cl.$^5$ ........................... F27D 7/00; C04B 35/50
[52] U.S. Cl. ........................................ 264/65; 501/126; 501/134
[58] Field of Search .................... 264/65, 56; 501/134, 501/126

[56] References Cited

U.S. PATENT DOCUMENTS 4,962,071 10/1990 Bayard .

OTHER PUBLICATIONS

Fraser et al., *J. Electrochem. Soc.:* "Solid State Science and Technology", 119 (10), 1368-1374 (1972).

Primary Examiner—James Lowe
Assistant Examiner—Christopher A. Fiorilla
Attorney, Agent, or Firm—Seidel, Gonda, Lavorgna & Monaco

[57] ABSTRACT

In manufacturing a high-density ITO sputtering target by press-molding a powder mixture consisting essentially of indium oxide and tin oxide is compacted and the resulting compact is sintered. The sintering is performed in an atmosphere of oxygen under a pressure of at least one atmosphere (gauge pressure). The present invention offers very advantageous effects from the industrial viewpoint in that it permits mass production of high-performance, high-density ITO targets at low cost using mass productivity.

4 Claims, 3 Drawing Sheets

METHOD OF MANUFACTURING ITO SPUTTERING TARGET

FIELD OF THE INVENTION

This invention relates to a method of manufacturing a "high-density sintered target" for use in forming an ITO Indium-Tin Oxide film by sputtering.

BACKGROUND OF THE INVENTION

The oxide film of $In_2O_3$-$SnO_2$, called "ITO film," exhibits the semiconductor characteristics of n-type conductivity. Its high conductivity plus visible light transmissivity make the ITO film useful in a wide range of applications. Recent applications include liquid-crystal display devices, thin-film electroluminescent display devices, radiation detector elements, transparent tablets of terminal equipments, defogging heater films for windowpanes, antistatic films, and selective permeable membranes for solar heat collectors. The ITO film is formed by a variety of known techniques, such as chemical processes, e.g., spraying which utilizes the pyrolysis of a compound, and chemical vapor deposition (CVD); and physical processes, e.g., vacuum evaporation and sputtering. Of these, sputtering is finding extensive adoption because of growing interest in its advantage that the production of films having large-area is permitted. Further films of low resistivity may be formed with good reproducibility.

In forming an ITO film by sputtering, a sputtering target consisting of indium oxide and tin oxide (hereinafter called "ITO target" for brevity) is used. ITO targets usually have been made by press-molding a powder mixture of indium oxide and tin oxide, with or without the addition of a dopant, at ordinary temperature and by then sintering the resulting green compact in an ambient air atmosphere at 1250° to 1650° C.

Unfortunately, indium oxide powder and tin oxide powder are difficult to sinter. The ITO targets made by the above process (cold-pressing and atmospheric sintering), therefore, have densities of only 4.2 to 5.0 $g/cm^3$, or at most about 60 to 70% of the theoretical density value. Another factor placing a limit upon the density and hampering its rise to higher levels is the consideration of density reproducibility. It is generally accepted knowledge in the art is that if large targets are to be manufactured steadily on an industrial scale, it is necessary to keep their density from reaching above approximately 5.0 $g/cm^3$. Disadvantages of these low density ITO targets so far pointed out have included:
  a) Low sputtering rate (film forming rate)
  b) Short target life
  c) Pronounced surface blackening tendency of ITO, and
  d) Increased dust (particle) deposition on the substrate.

In view of these disadvantage, and for the enhancement of sputtering operation efficiency, and for the qualitative improvement of the resulting ITO film, there has been strong demand for ITO targets of higher densities.

An attempt has been made to apply hot pressing in the step of compacting the starting powder material in a series of, for the purpose of improving the density of ITO target. The compaction step is one in a series of the target-making steps. It was found possible in that way to increase the ITO target density with relative ease to about 6.7 $g/cm^3$ (about 94% of the theoretical). Thus, hot pressing has come into use for the manufacture of high density (6.0 to 6.7 $g/cm^3$) products.

However, the use of hot pressing in the manufacture of ITO targets has caused new problems, such as
  (a) very high initial investment and difficulty of building large-size equipment,
  (b) high running cost due to the necessity of expensive mold and associated parts, and
  (c) lowered mass-production ability resulting from operation rates of at most one batch or two per day.

Because of the adverse eventual effects of these difficulties upon the target price, the hot press technique can scarcely be regarded as a fully satisfactory means for commercial production.

OBJECT OF THE INVENTION

In view of the above, the present invention is aimed at establishing means capable of producing high-density ITO targets stably with high productivity, without the need for any extraordinarily expensive new equipment.

SUMMARY OF THE INVENTION

After extensive studies with diverse experiments performed from various angles, it has now been found that in the manufacture of a sintered ITO target, sintering a compression-molded oxide powder mixture in a specific atmosphere where partial pressure of oxygen is high, will give a sintered ITO product with a very high density and fully satisfactory performance as a sputtering target. This is so even when cold pressing has been used for the compression molding of the mixture, rather than hot pressing.

The present invention, based on the above discovery, provides a method of the manufacture of an ITO target by press-molding a powder mixture consisting chiefly of indium oxide and tin oxide followed by sintering the resulting compact, characterized in that the sintering is conducted in a pressurized oxygen atmosphere of at least one atm., whereby an ITO target having as-high a density as close to the theoretical can be produced with good productivity and at low cost.

As used herein the expression "a pressurized oxygen atmosphere of at least one atm." means not merely an atmosphere of pure oxygen under a pressure of no less than one atm. (gauge pressure), but also a mixed gas atmosphere in which the partial pressure of $O_2$ is no less than one atm..

DETAILED DESCRIPTION

Figure 1:
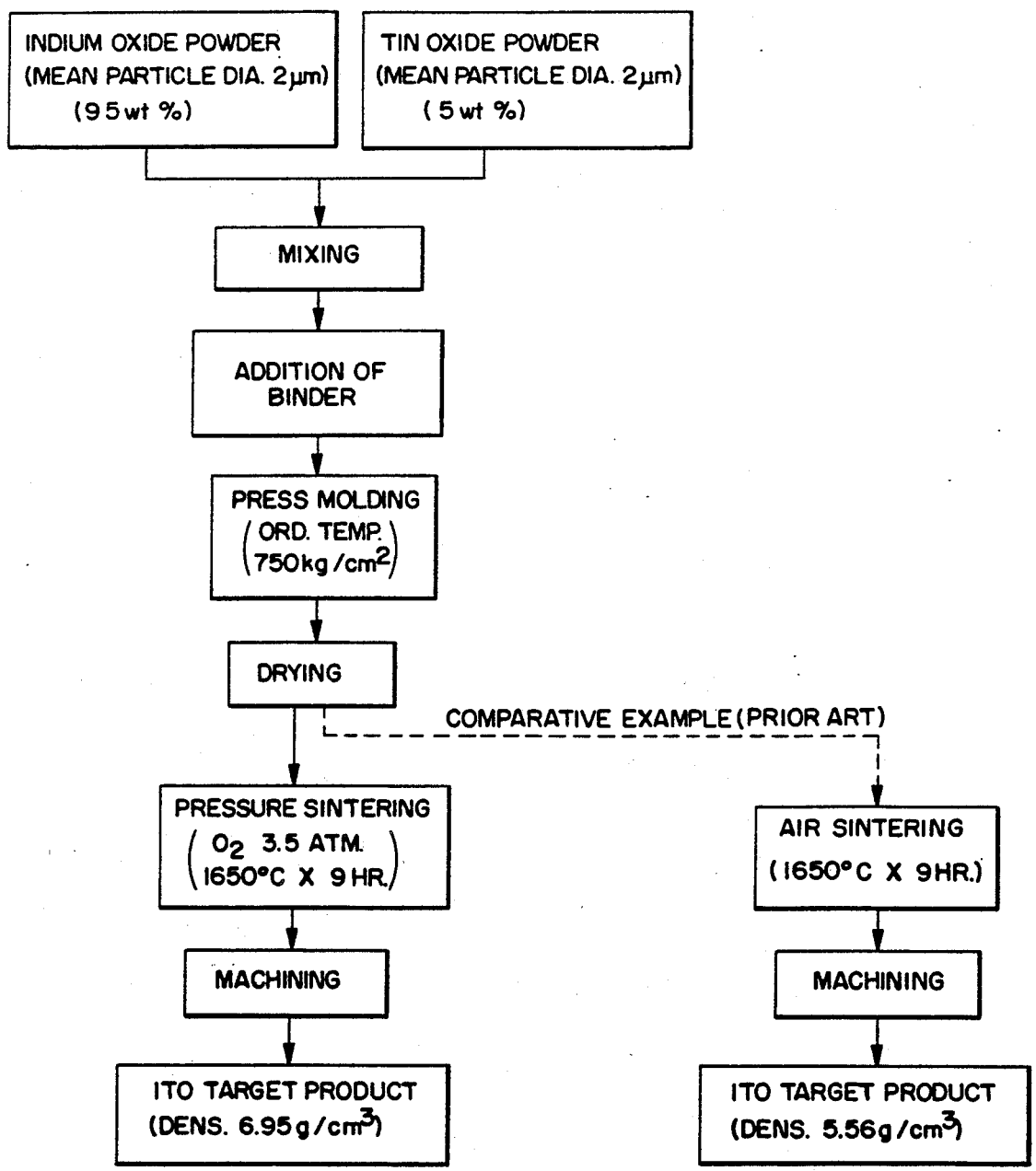
FIGS. 1 to 3 are flow sheets illustrating the sequences of steps for the manufacture of ITO targets in three different examples of the invention and in their respective comparative examples.

The present invention, together with its functions and effects, will be better understood from the following detailed description.

The reasons why high-density products with good performance can be obtained by the use of a pressurized oxygen atmosphere in the sintering step during the manufacture of an ITO target are yet to be fully clarified. In this connection, it has been confirmed that sintering in an atmosphere of an inert gas such as $N_2$ or Ar can cause decomposition of ITO, resulting in a sintered body of reduced density. This fact suggests that ITO by nature will easily release oxygen upon heating to elevated temperature. Hence it is presumed that sintering in oxygen under pressure effectively prevents the dissociation of ITO upon high-temperature heating, while oxygen acts like a sintering assistant, and thereby contributes to the improvement in density.

If the partial pressure of $O_2$ in the sintering atmosphere is less than one atm. (gauge), the density-increasing effect on the sintered body is so small that no ITO target with quite satisfactory performance will result. It is for this reason that the sintering atmosphere in the present invention is restricted to "a pressurized oxygen atmosphere of at least one atm." To secure a more favorable effect, it is preferable to set the partial pressure of $O_2$ in the sintering atmosphere to 3 atm. or upwards. While no upper limit is specified for the pressure, it would be advisable to fix the upper limit on the order of 10 atm., in consideration of the pressure resistance of ordinary equipment.

It is desired that the sintering atmosphere is, where available, an atmosphere of pure oxygen under pressure, the pressure being between 1 and 10 atm., preferably between 3 and 10 atm.. As noted already, a mixed gas atmosphere of oxygen gas and one or more inert gasses which does not react with oxygen may be used as well, provided the partial pressure of $O_2$ in the mixed gas is one atm. or more.

As with ordinary sintering, the sintering temperature in the pressurized oxygen atmosphere is appropriately between 1600° and 1700° C. Also, the sintering time is desired to be 3 hours or more (the longer the sintering time the better).

As described above, the method of the invention for manufacturing ITO targets achieves advantageous effects over the conventional cold-pressing-atmospheric-sintering method in that it yields products of higher densities (97 to 99% of the theoretical density) with good density reproducibility Compared with the ordinary hot-pressing method, the present method permits enjoyment of the marked advantages of low investment in equipment and low running cost, yet has a far greater capacity for mass production. These advantages are particularly pronounced when ITO targets with a $SnO_2$ content of 5 to 10% by weight are made.

The advantageous effects of the invention will now be more concretely described with the reference to the accompanying drawings illustrating examples thereof and comparative examples.

EXAMPLE 1

In this example, an ITO target was made in the sequence of steps represented by the flow sheet in FIG. 1.

First, indium oxide powder with a means particle diameter of 2 μm and tin oxide powder of the same particle size were mixed uniformly in a weight ratio of 95:5. After the addition of a molding binder, the mixture was evenly charged into a mold of 165 mm width by 520 mm length, and compacted by a hydraulic press at a pressure of 750 kg/cm². The density of the green compact thus obtained was 4.06 g/cm³.

The compact then was dried by heating to 80° C. and evaporating water from the binder.

Next, using a pressure sintering furnace, the dry compact was sintered in a pure oxygen atmosphere at 3.5 atm. (gauge, the absolute pressure being 4.5 atm.) at 1650° C. for 9 hours. The surface of the sintered body was ground by a surface grinder, and cut on sides by a diamond cutter into a target product.

The density of the ITO target product so obtained was calculated from its volume and weight, and an exceptionally high value of 6.95 g/cm³ was confirmed.

For comparison purposes, another ITO target was made on trial, this time under the following conditions.

A dry compact was obtained under exactly the same conditions a in the above example of the invention down to the drying step. In the following step of sintering, an "air atmosphere" as in the prior art was used instead. The compact was sintered in an air atmosphere at 1650° C. for 9 hours, and the sintered body was machined into an ITO target. Density measurement of the product obtained in the comparative example gave a value of as small as 5.56 g/cm³.

As is obvious from the results of the example, sintering in a pressurized oxygen atmosphere as specified by the invention is highly effective in improving the density of a sintered product for use as an ITO target.

EXAMPLE 2

Figure 2:
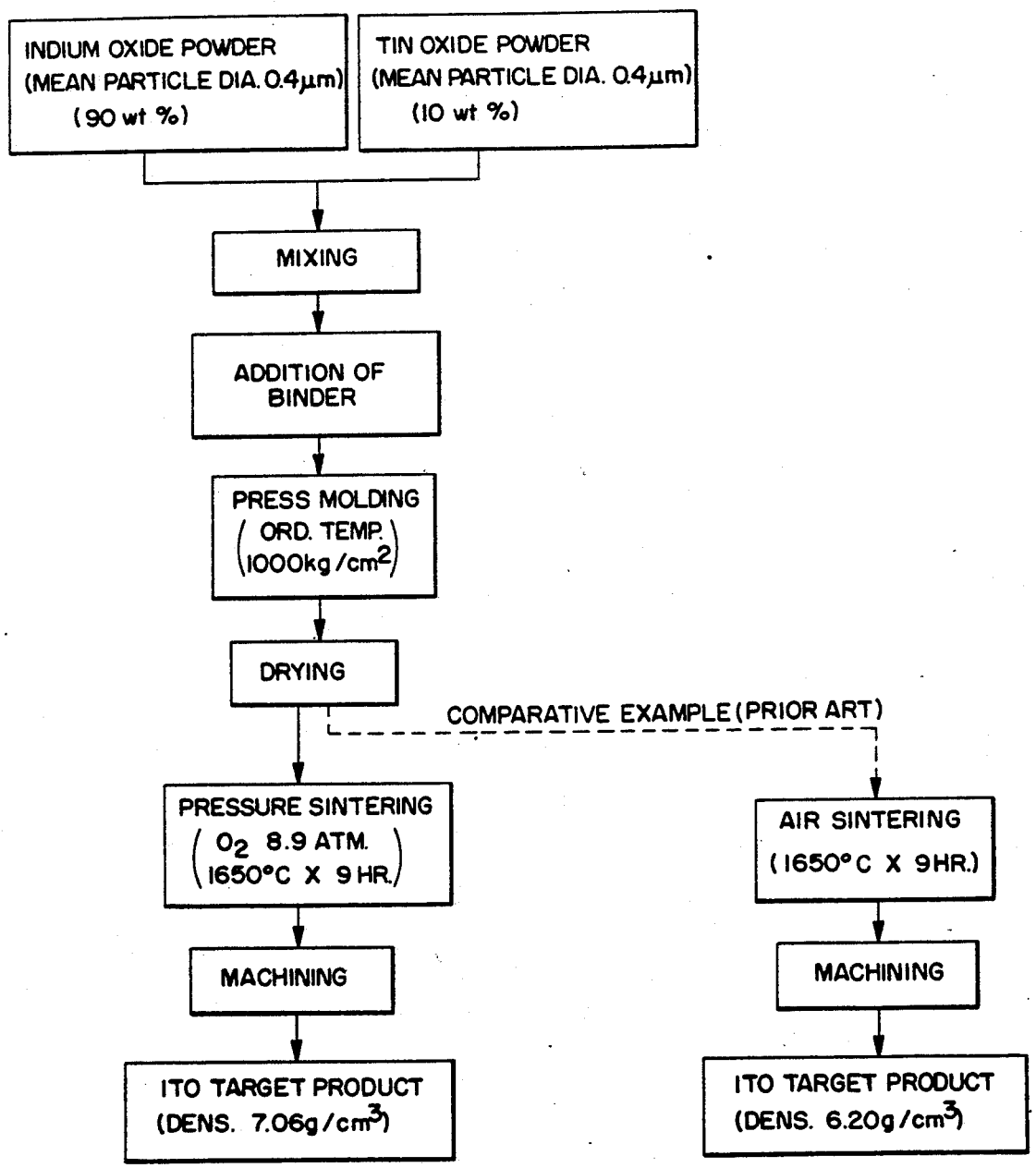

In this example an ITO target was made following the sequence of steps in the flow sheet of FIG. 2.

First, indium oxide powder having a mean particle diameter of 0.4 μm and tin oxide powder of the same particle size were thoroughly mixed in a weight ratio of 90:10. With the addition of a molding binder, the mixture was filled evenly into a mold 165 mm wide by 520 mm long and molded at a pressure of 1000 kg/cm² by a hydraulic press. The density of the green compact was 3.98 g/cm³.

The compact was heated to 80° C. and dried through evaporation of water from the binder.

Next, using a pressure sintering furnace, the dried compact was sintered in a pure oxygen gas atmosphere under a pressure of 8.9 atm. (gauge, the absolute pressure being 9.9 atm.) at 1650° C. for 9 hours. The surface of the sintered body was ground by a surface grinder and cut on sides by a diamond cutter into a target product.

The density of the ITO target product thus obtained was calculated from its volume and weight and found to be as high as 7.06 g/cm³.

Comparatively, another ITO target was made using the following conditions.

A dry compact was obtained in exactly the same manner as in the preceding example of the invention down to the drying step. In the ensuing step of sintering, ordinary "air atmosphere" was employed instead of pure oxygen. The compact was sintered in that atmosphere at 1650° C. for 9 hours, and the sintered body machined into an ITO target. Density measurement of the comparative product gave a value of as low as 6.20 g/cm³.

The results of this example demonstrate that sintering in a pressurized oxygen atmosphere as specified by the invention is highly effective in improving the sintered density of ITO target.

EXAMPLE 3

Figure 3:
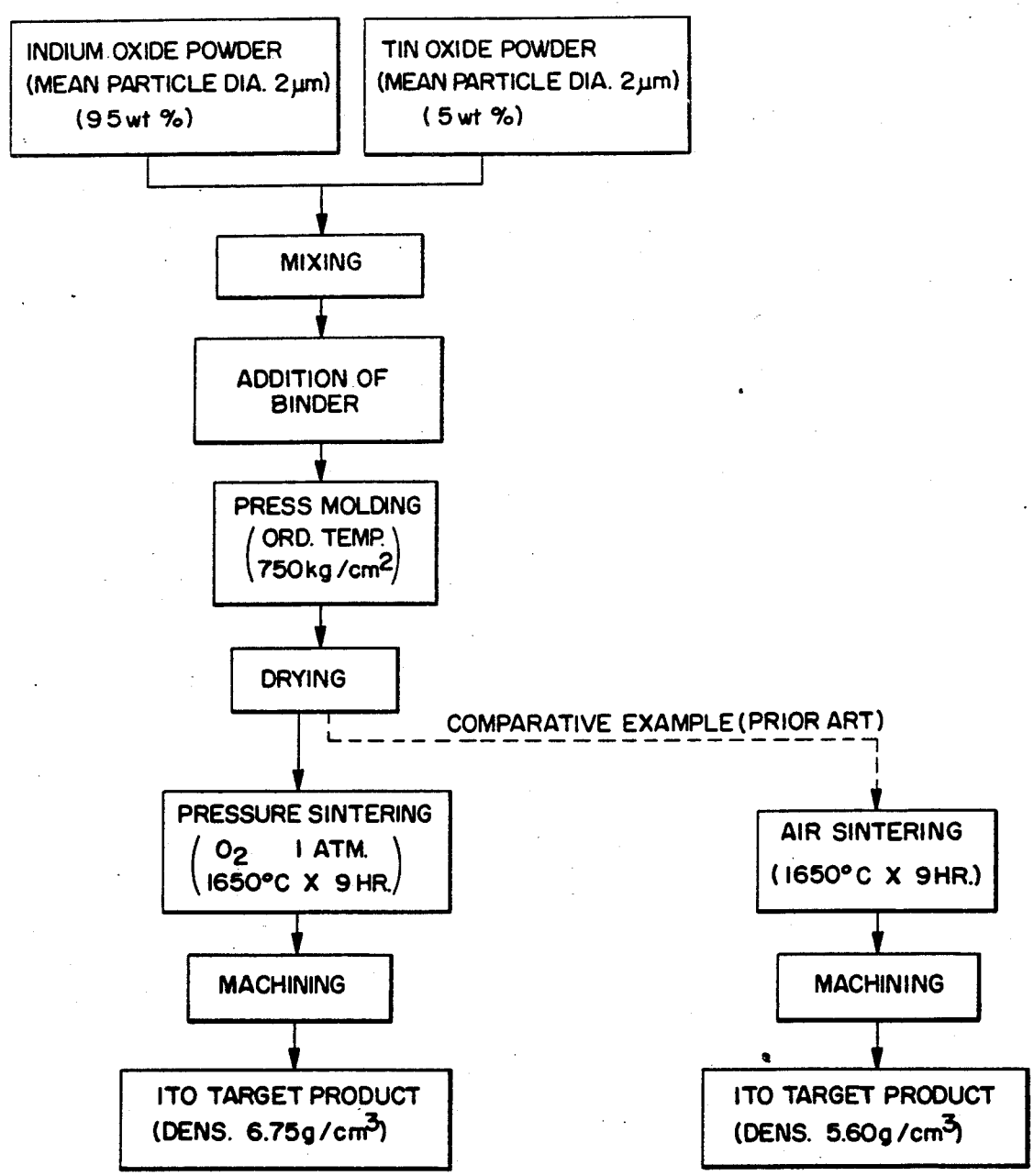

In this example, an ITO target was made following the sequence of steps in the flow sheet of FIG. 3.

First, indium oxide powder having a mean particle diameter of 2 μm and tin oxide powder of the same particle size were thoroughly mixed in a weight ratio of 95:5. With the addition of a molding binder, the mixture was filled evenly into a mold 165 mm wide by 520 mm long and molded at a pressure of 750 kg/cm² by a hydraulic press. The density of the green compact was 4.09 g/cm³.

The compact was heated at 80° C. to evaporate water from the binder until it was dry.

Next, by means of a pressure sintering furnace, the dried compact was sintered in a pure oxygen gas atmosphere under a pressure of 1.0 atm. (gauge, the absolute pressure being 2.0 atm.) at 1650° C. for 9 hours. The surface of the sintered body was ground by a surface grinder and cut on sides by a diamond cutter into a target product.

The density of the ITO target product thus obtained was calculated from its volume and weight and found to be as high as 6.75 g/cm³.

For comparison, another ITO target was made under the following conditions.

A dry compact was obtained by exactly the same procedure as in the preceding example of the invention down to the drying step. In the ensuing step of sintering, an "air atmosphere" was employed instead. The compact was sintered in that atmosphere at 1650° C. for 9 hours, and the sintered body was machined to obtain an ITO target. Density measurement of the comparative product gave a value of 5.60 g/cm³.

The results of this example prove that sintering in a pressurized oxygen atmosphere as taught by the invention is effective to improve the sintered density of ITO target.

As described above, the present invention offers very advantageous effects from the industrial viewpoint in that it permits mass production of high-performance, high-density ITO targets with good productivity and at low cost.

What is claimed is:

1. A method of manufacturing a high-density ITO sputtering target comprising press-molding a powder mixture comprising indium oxide and tin oxide, followed by sintering the resulting compact in a pure oxygen atmosphere pressurized to at least 1 atmosphere gauge pressure or in a mixed gas atmosphere of oxygen and at least one inert gas which does not react with oxygen, said mixed gas being pressurized to an oxygen partial pressure of at least one atmosphere gauge pressure.

2. A method according to claim 1 wherein the sintering atmosphere comprises oxygen at a pressure in the range from 3 to 10 atmospheres gauge pressure.

3. A method according to claim 1 wherein the sintering temperature ranges between 1600° and 1700° C.

4. A method according to claim 1 wherein the target composition comprises from 5 to 10% by weight of tin oxide, the balance being substantially indium oxide.

* * * * *